(12) United States Patent
Bessho

(10) Patent No.: US 7,221,585 B2
(45) Date of Patent: May 22, 2007

(54) CHOOSING READ/WRITE CURRENT POLARITIES TO REDUCE ERRORS IN A MAGNETIC MEMORY

(75) Inventor: Kazuhiro Bessho, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/220,132

(22) Filed: Sep. 6, 2005

(65) Prior Publication Data

US 2006/0098480 A1    May 11, 2006

(30) Foreign Application Priority Data

Sep. 6, 2004    (JP)    ............................ P2004-258766

(51) Int. Cl.
*G11C 11/15* (2006.01)
(52) U.S. Cl. ...................................... 365/173; 365/158
(58) Field of Classification Search ................ 365/158, 365/173
See application file for complete search history.

(56) References Cited

U.S. PATENT DOCUMENTS 6,714,390 B2 * 3/2004 Terada et al. .......... 360/324.12
6,828,785 B2 * 12/2004 Hosomi et al. .............. 324/252

\* cited by examiner

*Primary Examiner*—Hoai V. Ho
(74) *Attorney, Agent, or Firm*—Wolf, Greenfield & Sacks, P.C.

(57) ABSTRACT

A memory is composed o a storage element 10 having a magnetization fixed layer 3 provided relative to a storage layer 5 through an intermediate layer 4 in which the direction of magnetization of the storage layer 5 is changed with application of an electric current to the storage element 10 in the lamination layer direction to record information on the storage layer 5 and a wiring through which an electric current flows to the lamination layer direction of the storage element 10, wherein when information is read out from the storage layer 5, an electric current of the same polarity as that of an electric current to record information in such a manner that an electric resistance of the storage element 10 is changed from the high resistance state to the low resistance state flows through the wiring to the storage element 10.

1 Claim, 7 Drawing Sheets

CHOOSING READ/WRITE CURRENT POLARITIES TO REDUCE ERRORS IN A MAGNETIC MEMORY

CROSS REFERENCES TO RELATED APPLICATIONS

The present invention contains subject matter related to Japanese Patent Application JP 2004-258766 filed in the Japanese Patent Office on Sep. 6, 2004, the entire contents of which being incorporated herein by reference.

BACKGROUND OF THE INVENTION

1. Field of the Invention

The present invention relates to a memory including a storage element composed of a storage layer to store the magnetization state of a ferromagnetic layer as information and a magnetization fixed layer of which magnetization direction is fixed and in which the magnetization direction is changed with application of an electric current. More particularly, this invention relates to a memory suitable for use as the application to a nonvolatile memory.

2. Description of the Related Art

As information communication equipment, in particular, personal small information equipment such as personal digital assistants is widespread rapidly, it is requested that devices such as memory and logic constructing personal small information equipment should become higher in performance in such a way as to become higher in integration degree, to become higher in operation speed and to become smaller in power consumption.

In particular, technologies to make semiconductor non-volatile memories become higher in speed and larger in storage capacity become more important as complementary technologies to a magnetic hard disk which has been so far essentially difficult to be miniaturized, to become higher in speed and to become lower in power consumption due to the presence of movable parts and the like. Also, the above-mentioned technologies to realize the above-mentioned high-speed and large-capacity semiconductor nonvolatile memory become more important in order to realize new functions such as a so-called "instant on" by which an operation system can get started at the same time it is energized.

A semiconductor flash memory and a FeRAM (ferroelectric nonvolatile memory) and the like are now commercially available as the nonvolatile memory, and such nonvolatile memories are now under active research and development in order to make nonvolatile memories become higher in performance.

In recent years, as a new nonvolatile memory using a magnetic material, a MRAM (magnetic random-access memory) using a tunnel magnetoresistive effect has been developed and advanced so far remarkably and it now receive a remarkable attention (see Cited Non-Patent References 1 and 2, for example).

This MRAM has a structure in which very small magnetic memory devices to record information are located regularly, wirings, for example, word lines and bit lines being provided to access these magnetic memory devices.

Each magnetic memory device includes a storage layer to record information as the magnetization direction of a ferromagnetic material.

Then, as the arrangement of the magnetic memory device, there is employed a structure using a so-called magnetic tunnel junction (MTJ: magnetic tunnel junction) composed of the above-mentioned storage layer, a tunnel insulating layer (nonmagnetic spacer film) and a magnetization fixed layer whose magnetization direction is fixed. The magnetization direction of the magnetization fixed layer can be fixed by providing an antiferromagnetic layer, for example.

Since this structure generates a so-called tunnel magnetoresistive effect in which a resistance value relative to a tunnel electric current flowing through the tunnel insulating film changes in response to an angle formed between the magnetization direction of the storage layer and the magnetization direction of the magnetization fixed layer, it is possible to write (record) information by using this tunnel magnetoresistive effect. The magnitude of this resistance value becomes the maximum value when the magnetization direction of the storage layer and the magnetization direction of the magnetization fixed layer are anti-parallel to each other and it becomes the minimum value when they are parallel to each other.

According to the magnetic memory device having the above-mentioned arrangement, information can be written (recorded) on the magnetic memory device by controlling the magnetization direction of the storage layer of the magnetic memory device with application of a synthesized electric current magnetic field generated when an electric current flows through both of the word line and the bit line. It is customary to store a difference between the resultant magnetization directions (magnetized states) of the storage layer in response to "0" information or "1" information.

When on the other hand recorded information is read out from the magnetic memory device, a memory cell is selected by using a device such as a transistor and a difference between the magnetization directions of the storage layer is detected as a difference between voltage signals by using the tunnel magnetoresistive effect of the magnetic memory device, whereby recorded information can be detected.

Having compared this MRAM with other nonvolatile memories, it is to be understood that the maximum merit of the MRAM is that, since "0" information and "1" information are rewritten by inverting the magnetization direction of the storage layer formed of the ferromagnetic material, the MRAM can be rewritten at a high speed nearly infinitely ($>10^{15}$ times).

However, the MRAM has to generate a relatively large electric current magnetic field to rewrite recorded information and hence an electric current of a certain large magnitude (for example, about several milliamperes (mA)) should flow through the address wirings. Therefore, it is unavoidable that power consumption of the MRAM is increased considerably.

Also, the MRAM needs write address wiring and read address wiring and hence it has been difficult to microminiaturize a memory cell from a structure standpoint.

Further, as the device is microminiaturized increasingly, the address wiring also is reduced in width so that it becomes difficult to apply a sufficient electric current to the address wiring. In addition, since coercive force of the device is increased, a necessary electric current magnetic field is increased and hence power consumption of the device is increased.

Accordingly, it has been difficult to microminiaturize the device.

For this reason, a memory having an arrangement to use magnetization inversion generated by spin transfer receives a remarkable attention as an arrangement capable of inverting the magnetization direction with application of a small electric current.

Magnetization inversion generated by spin transfer is to cause magnetization inversion to occur in other magnetic material by injecting spin-polarized electrons from the magnetic material to other magnetic material (see Cited Patent Reference 1, for example).

Specifically, magnetization inversion generated by spin transfer is a phenomenon to give torque to the magnetization of this magnetic layer when spin-polarized electrons passed through the magnetic layer (magnetization fixed layer) of which magnetization direction is fixed enter other magnetic layer (magnetization free layer) whose magnetization direction is not fixed. Then, the magnetization direction of the magnetic layer (magnetization free layer) can be inverted with application of an electric current of a magnitude higher than a certain threshold value.

For example, with application of an electric current to a giant magnetoresistive effect device (GMR device) or a magnetic tunnel junction device (MTJ device) including a magnetization fixed layer and a magnetization free layer in the direction perpendicular to the film plane thereof, the magnetization direction of at least a part of the magnetic layer of these devices can be inverted.

Thus, when the storage element including the magnetization fixed layer and the magnetization free layer (storage layer) is constructed and a polarity of an electric current flowing through the storage element is changed, the magnetization direction of the storage layer is inverted to rewrite "0" information and "1" information.

When recorded information is read out from the memory, recorded information can be read out from the memory by using the tunnel magnetoresistive effect similarly to the MRAM because this memory has the arrangement in which the tunnel insulating layer is provided between the magnetization fixed layer and the magnetization free layer (storage layer).

Then, magnetization inversion based on spin transfer has an advantage in that magnetization inversion can be realized without increasing an electric current even when the device is microminiaturized.

An absolute value of an electric current flowing through the storage element to invert the magnetization direction is less than 1 mA in a storage element of the scale of approximately 0.1 µm, for example. In addition, the above-mentioned absolute value is decreased in proportion to a volume of a storage element, which is advantageous from a scaling standpoint.

In addition, since the recording word line, which has been required by the MRAM, becomes unnecessary, this memory has an advantage in that the arrangement of the memory cell can be simplified.

[Cited Non-Patent Reference 1]: NIKKEI ELECTRONICS, 2001, VOL. 2. 12 (pp. 164 to 171)

[Cited Non-Patent Reference 2]: J. NaHas et al., IEEE/ISSCC 2004 Visulas Supplement, p. 22

[Cited Patent Reference 1]: Official Gazette of Japanese laid-open patent application No. 2003-17782

If the memory is constructed by using the magnetization inversion based on the above-mentioned spin transfer, then when information is written in the storage layer (information is rewritten by "0" information and "1" information) and information is read out from the storage layer, an electric current passes the same channel.

For this reason, it is requested that a read electric current should be set sufficiently lower than a write electric current and that dispersions of both read and write electric currents should be suppressed at the minimum so that information may be prevented from being written by mistake during information is being read out from the memory.

FIG. 1 of the accompanying drawings is a schematic cross-sectional view showing an arrangement of a storage element capable of recording information by using spin transfer according to the related art.

As shown in FIG. 1, this storage element 110 is composed of an underlayer 101, an antiferromagnetic layer 102, a magnetization fixed layer 103, a nonmagnetic layer 104, a storage layer 105 and a capping layer 106 laminated with each other, in that order, from the lower layer.

The storage layer 105 is made of a ferromagnetic material having uniaxial magnetic anisotropy and the storage element 110 is able to store information therein depending on the magnetization state of this storage layer 105, that is, the direction of a magnetization M112 of the storage layer 105.

The magnetization fixed layer 103 made of a ferromagnetic material and of which direction of a magnetization M111 is fixed is provided through the nonmagnetic layer 104 to the storage layer 105. In the arrangement shown in FIG. 1, since the antiferromagnetic layer 102 is formed on the lower layer of the magnetization fixed layer 103, the direction of the magnetization M111 of the magnetization fixed layer 103 is fixed by the action of this antiferromagnetic layer 102.

When information is written in this storage element 110, the direction of the magnetization direction M112 of the storage layer 105 is inverted based on spin transfer with application of an electric current flowing through the direction perpendicular to the film plane of the storage layer 105, that is, the lamination layer direction of the storage element 110.

Magnetization inversion based on spin transfer will be described in brief.

Electron has two kinds of spin angular momentums. Let it be assumed that the two kinds of spin angular momentums are defined as upward spin angular momentum and downward spin angular momentum. Both of the upward spin angular momentums and the downward spin angular momentums are of the same number within the nonmagnetic material but they are different in number within the ferromagnetic material.

In the storage element 110 shown in FIG. 1, let it be considered the case in which the directions of the magnetic moments are anti-parallel to each other in the magnetization fixed layer 103 and the storage layer 105 and in which electrons are to be transferred from the magnetization fixed layer 103 to the storage layer 105.

Electrons passed through the magnetization fixed layer 103 are spin-polarized so that the upward spin angular momentum and the downward spin angular momentum are different from each other in number.

If electrons reach the other magnetic material before the thickness of the nonmagnetic layer 104 is sufficiently thin so that spin polarization is relaxed and electrons are placed in the non-polarized state (upward spin momentum and downward spin momentum are the same in number) of the ordinary nonmagnetic material, then since the directions of the magnetic moments of the magnetization fixed layer 103 and the storage layer 105 are anti-parallel to each other and signs of degree of spin polarization are opposite to each other, a part of electrons is inverted, that is, the direction of the spin angular momentum is changed in order to decrease energy of the system. At that time, since a total angular momentum of the system should be preserved, reaction equivalent to the total of angular momentums changed by electrons of which directions are changed is given to the magnetic moment of the storage layer 105.

When there are few electric currents, that is, electrons passed at the unit time, there are a small total number of electrons whose directions are to be changed so that the change of the angular momentum generated in the magnetic moment of the storage layer 105 is small. However, when an electric current is increased, many changes of the angular momentums can be given to the electrons within the unit time. The time change of the angular momentum is torque. When torque exceeds a threshold value, the magnetic moment M112 of the storage layer 105 starts to be inverted and it is stabilized after it was rotated 180 degrees owing to its uniaxial magnetic anisotropy. That is, the magnetic moment is inverted from the anti-parallel state to the parallel state.

On the other hand, when the directions of the magnetic moments are parallel to each other in the magnetization fixed layer 103 and the storage layer 105, if an electric current flows through the direction to transfer electrons from the storage layer 105 to the magnetization fixed layer 103, then torque is applied to the magnetization fixed layer 103 and the storage layer 105 when electrons spin-inverted after they were reflected on the magnetization fixed layer 103 enter the storage layer 105 with the result that the magnetic moments can be inverted from the parallel state into the anti-parallel state.

However, an amount of an electric current required to invert the magnetic moments from the parallel state to the anti-parallel state is increased more as compared with that required when the magnetic moments are inverted from the anti-parallel state to the parallel state.

As described above, information ("0" information and "1" information) is recorded on the storage layer 105 with application of electric currents higher than a certain threshold value corresponding to the respective polarities in the direction from the magnetization fixed layer 103 to the storage layer 105 and vice versa.

Also, information can be read out from the storage layer 105 by using a resistance change dependent on a relative angle between the magnetic moments of the storage layer 105 and the magnetization fixed layer (reference layer) 103, that is, a so-called magnetoresistive effect in which the minimum resistance is obtained when the magnetic moments are parallel to each other and in which the maximum resistance is obtained when the magnetic moments are anti-parallel to each other.

Specifically, when a substantially constant voltage is applied to the storage element 110 and a magnitude of an electric current flowing at that time is detected, information can be read out from the storage layer 105.

In the following description, a relationship between the resistance state of the storage element 110 and information will be prescribed in such a manner that a low resistance state is prescribed as "1" information, a high resistance state being prescribed as "0" information, respectively.

Also, an electric current to transfer electrons from the capping layer 106 shown in FIG. 1 to the underlayer 101, that is, from the upper layer to the lower layer is prescribed as a positive polarity electric current. At that time, when a positive polarity electric current flows through the storage element 110, electrons are transferred from the capping layer 106 to the underlayer 101, that is, from the storage layer 105 to the magnetization fixed layer 103 so that the direction of the magnetization M111 of the magnetization fixed layer 103 and the direction of the magnetization M112 of the storage layer 105 are placed in the anti-parallel state, thereby resulting in the storage element 110 being set to the high resistance state as mentioned hereinbefore.

Accordingly, an electric current to write "1" information (low resistance state) becomes negative in polarity and an electric current to write "0" information (high resistance state) becomes positive in polarity.

FIG. 2 is a schematic diagram showing a mutual relationship between operation electric currents for write operation and read operation in a storage element like the storage element 110, shown in FIG. 1, for recording information by using spin transfer. In FIG. 2, a horizontal axis represents an electric current and a vertical axis represents the number of elements through which an electric current of a certain magnitude flows upon predetermined operation.

FIG. 2 shows distributions and average values of electric currents +Iw and −Iw which are required to write "1" information or "0" information, respectively.

Further, in FIG. 2, Ir0 and Ir1 denote distributions and average values of electric currents required upon reading. Ir0 with a small electric current amount corresponds to the reading of the high resistance state ("0" information) and Ir1 with a large electric current amount corresponds to the reading of the low resistance state ("1" information). In FIG. 2, reference numeral Ic denotes an electric current which flows through a read reference cell (cell to generate a reference electric current for use with an operational amplifier for comparison). Reference numeral ΔI denotes a difference current corresponding to the change of resistance upon reading.

In the storage element for recording information by using spin transfer, it has been customary that a read electric current may have an arbitrary polarity.

Also, the write electric current −Iw with the write polarity, that is, the negative polarity may optionally correspond to the writing of "1" information or the writing of "0" information, which may be prescribed depending on the arrangement of the multilayer film of the storage element 110.

However, when the resistance value of "1" information, that is, the low resistance state is low, as shown in FIG. 3, the electric current Ir1 flowing through the storage element 110 when "1" information is read is increased and it becomes a value close to the electric current +Iw required to write information. As a result, it is frequently observed that the bottom edges of the distributions of the electric current values having dispersions may overlap with each other.

At that time, since the distributions of the electric current values of the read electric current Ir1 and the write electric current +Iw overlap with each other, there is a possibility that an error which causes information to be written in the storage element 110 although information should be read out from the storage element 110 will occur.

Then, this fact becomes disadvantageous against the case in which it is intended to decrease the write electric current +Iw in order to decrease electric power and the like. Further, from a development standpoint, this fact inevitably encounters with the difficulties in which dispersions of the write electric current and the read electric current should be suppressed in order to decrease the portion in which the write electric current and the read electric current overlap with each other.

SUMMARY OF THE INVENTION

In view of the aforesaid aspects, the present invention intends to provide a memory in which errors occurred when an information read electric current and an information write electric current of a storage element interfere with each other can be decreased essentially.

Also, the present invention intends to provide a memory which can be made highly-reliable relatively easily.

According to an aspect of the present invention, there is provided a memory which is composed of a storage element including a storage layer for storing therein information based on the magnetization state of a magnetic material and a magnetization fixed layer provided relative to the storage layer through an intermediate layer in which the direction of magnetization of the storage layer is changed with application of an electric current flowing through the lamination layer direction to record information on the storage layer and an electric current supplying device for applying an electric current to the storage element in the lamination layer direction, wherein when information is read out from the storage layer, an electric current of the same polarity as that of an electric current for recording information in such a manner that an electrical resistance of the storage element is changed from the high resistance state to the low resistance state flows through the electric current supplying device to the storage element.

According to the above-mentioned arrangement of the memory of the present invention, the memory includes the storage element and the electric current supplying means (electrodes, wirings, power supply, etc.) for applying an electric current to this storage element in the lamination layer direction, wherein when information is read out from the storage layer, an electric current of the same polarity as that of an electric current required to record information such that an electric resistance of the storage element is changed from the high resistance state to the low resistance state flows through the electric current supplying means to the storage element. Thus, when the storage element is in the low resistance state in which a large electric current flows through the storage element as compared with the case in which the storage element is in the high resistance state upon reading, even if a distribution of a read electric current partly overlaps with a distribution of a write electric current, then information that is to be written by the read electric current is limited to only the low resistance state, thereby suppressing the occurrence of errors in which the resistance state is changed by the read electric current.

That is, it becomes possible to essentially decrease the rate in which errors occur due to the interference between the distribution of the read electric current and the distribution of the write electric current.

As described above, according to the present invention, since the rate in which errors occur due to the interference between the distribution of the read electric current and the distribution of the write electric current can be decreased, even when a certain amount of dispersions occurs in the write electric current at every memory cell, it becomes possible to considerably decrease the rate in which the errors occur due to the interference.

Therefore, according to the present invention, it becomes possible to easily realize the highly-reliable memory.

DESCRIPTION OF THE PREFERRED EMBODIMENTS

Prior to the description of the specific embodiments of the present invention, the present invention will be outlined first.

Also in the following description, as mentioned hereinbefore, the low resistance state is prescribed as "1" information and the high resistance state is prescribed as "0" information, respectively. Also, an electric current to transfer electrons from the upper layer of the storage element to the lower layer is prescribed as a positive polarity electric current.

In the present invention, a relationship between a polarity of an electric current required to write information and a polarity of an electric current required to read information and a relationship between the magnitudes of the above-mentioned two electric currents are important.

In the present invention, the film arrangement of the storage element and the circuit arrangement of the memory are adjusted in such a manner that a write electric current which overlaps with a read electric current distribution of the low resistance state ("1" information) may become the operation to write the low resistance state ("1" information).

Figure 3:
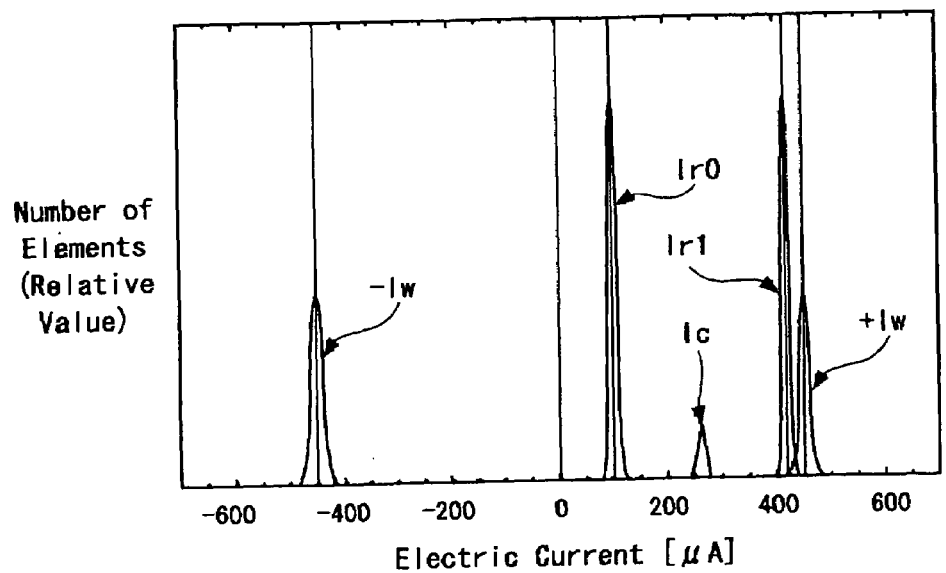
FIG. 3 is a diagram showing the case in which electric current distributions of a write electric current and a read electric current overlap with each other according to the related art.

According to the above-mentioned arrangement, even when respective electric current distributions of a positive polarity write electric current +IW and the read electric current Ir1 in the low resistance state ("1" information) overlap with each other as shown in FIG. 3, if "1" information is overwritten when "1" information is read out from the storage element, no error occurs and hence it becomes possible to avoid a problem in which an error which causes information to be written in the storage element although information should be read out from the storage element will occur.

Figure 1:
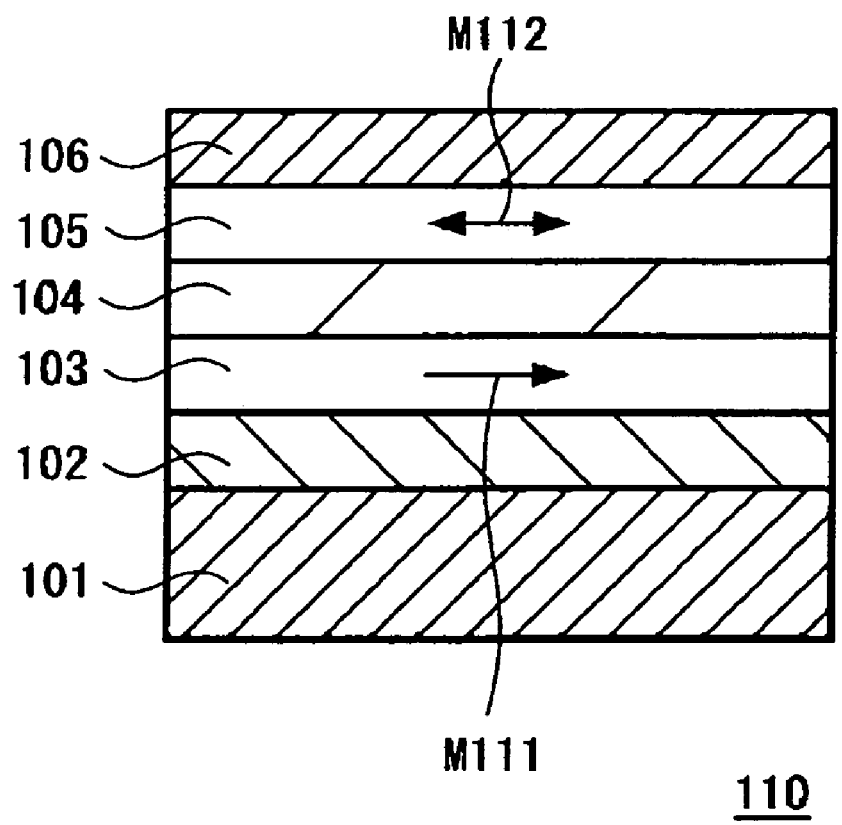
FIG. 1 is a schematic cross-sectional view showing an arrangement of a storage element capable of recording information by using spin transfer according to the related art.
Figure 2:
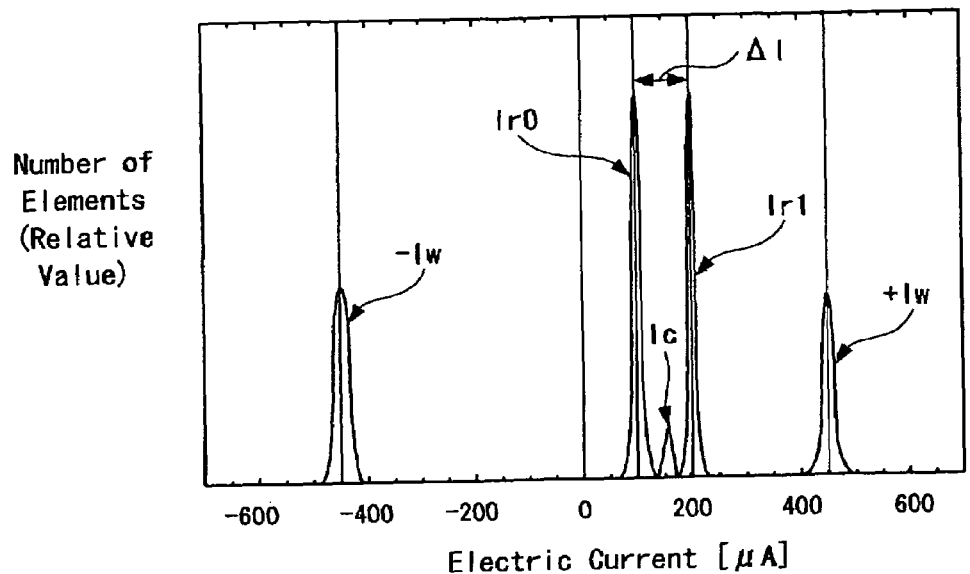
FIG. 2 is a diagram showing a mutual relationship between operation electric currents in write operations and read operations in the storage element capable of recording information by using spin transfer according to the related art.

When the storage element to record information by using spin transfer is constructed like the storage element 110 shown in FIG. 1, the storage element will be divided into four cases of the storage elements shown in FIGS. 4A to 4D based on a relative relationship between write electric currents −Iw, +Iw and read electric currents Ir0, Ir1 and a relative relationship between polarities of the write electric currents −Iw, +Iw and written information ("0" information and "1" information).

Figure 4A:
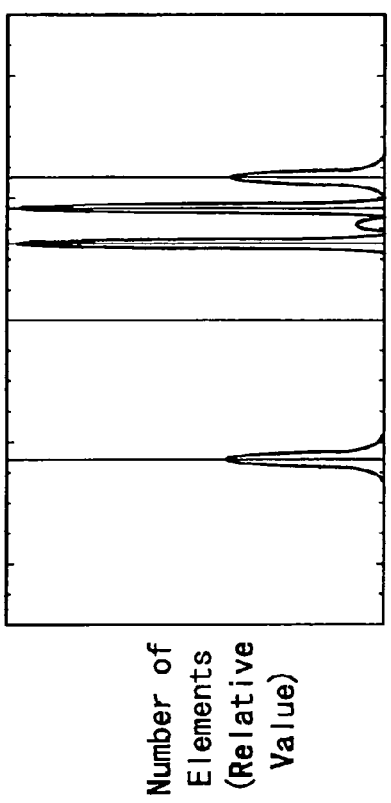
FIGS. 4A to 4D are respectively diagrams showing the cases of a mutual relationship between a write electric current and a read electric current and a mutual relationship between a polarity of a write electric current and written information on the case-by-case basis when the storage elements for recording information by using spin transfer are constructed.

FIG. 4A shows the storage element of the case in which a negative polarity write electric current −Iw is an electric current Iw1 to write "1" information, a positive polarity write electric current +Iw is an electric current Iw0 to write "0" information and read electric currents Ir0 and Ir1 are positive polarity electric currents.

Figure 4B:
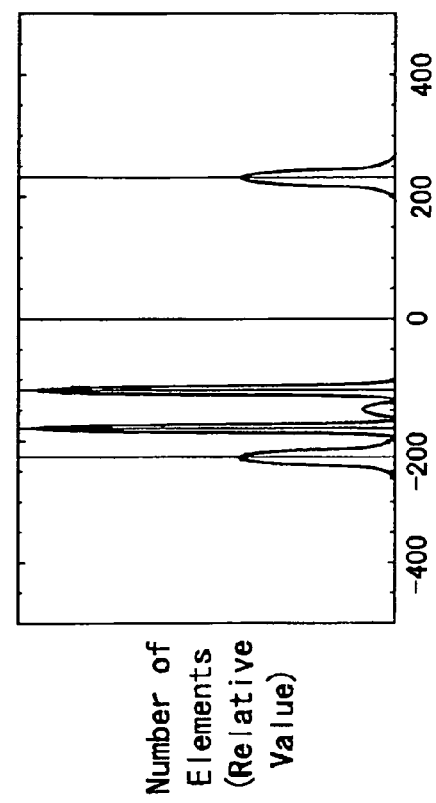

FIG. 4B shows the storage element of the case in which the negative polarity write electric current −Iw is the electric current Iw0 to write "0" information, the positive polarity write electric current +Iw is the electric current Iw1 to write "1" information and the read electric currents Ir0 and Ir1 are the positive polarity electric currents.

Figure 4C:
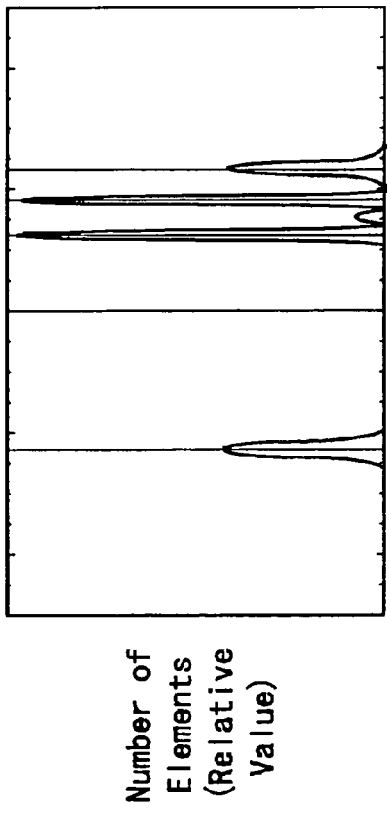

FIG. 4C shows the storage element of the case in which the negative polarity write electric current −Iw is the electric current Iw1 to write "1" information, the positive polarity write electric current +Iw is the electric current Iw0 to write "0" information and the read electric currents Ir0 and Ir1 are the negative polarity electric currents.

Figure 4D:
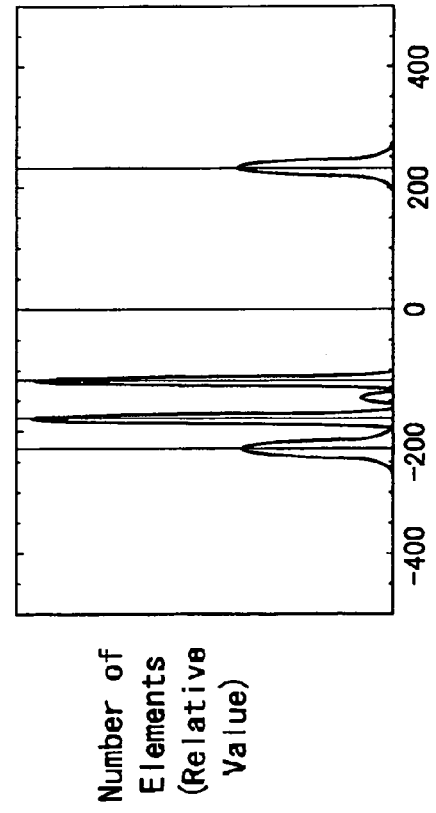

FIG. 4D shows the storage element of the case in which the negative polarity write electric current −Iw is the electric current Iw0 to write "0" information, the positive polarity write electric current +Iw is the electric current Iw1 to write "1" information and the read electric currents Ir0 and Ir1 are the negative polarity electric currents.

Since any polarity of the read electric currents has been selected, the storage element may have any arrangement of the arrangements corresponding to the four cases shown in FIGS. 4A to 4D.

There arise problems of interference between "1" information writing and "0" information reading and interference between "0" information writing and "1" information reading. As is clear from FIGS. 4A to 4D and FIG. 2, the read electric current Ir0 to read "0" information is small and hence interference between "1" information reading and "0" information writing causes a more serious problem.

Accordingly, if the multilayer film arrangement of the storage element and the polarity of the read electric current are prescribed in such a manner that a relationship between operation electric currents may become identical to the relationship shown in FIG. 4B or 4C in which the read electric current Ir1 to read "1" information and the write electric current Iw1 to write "1" information may become close to each other, then the occurrence of errors can be suppressed.

Figure 5:
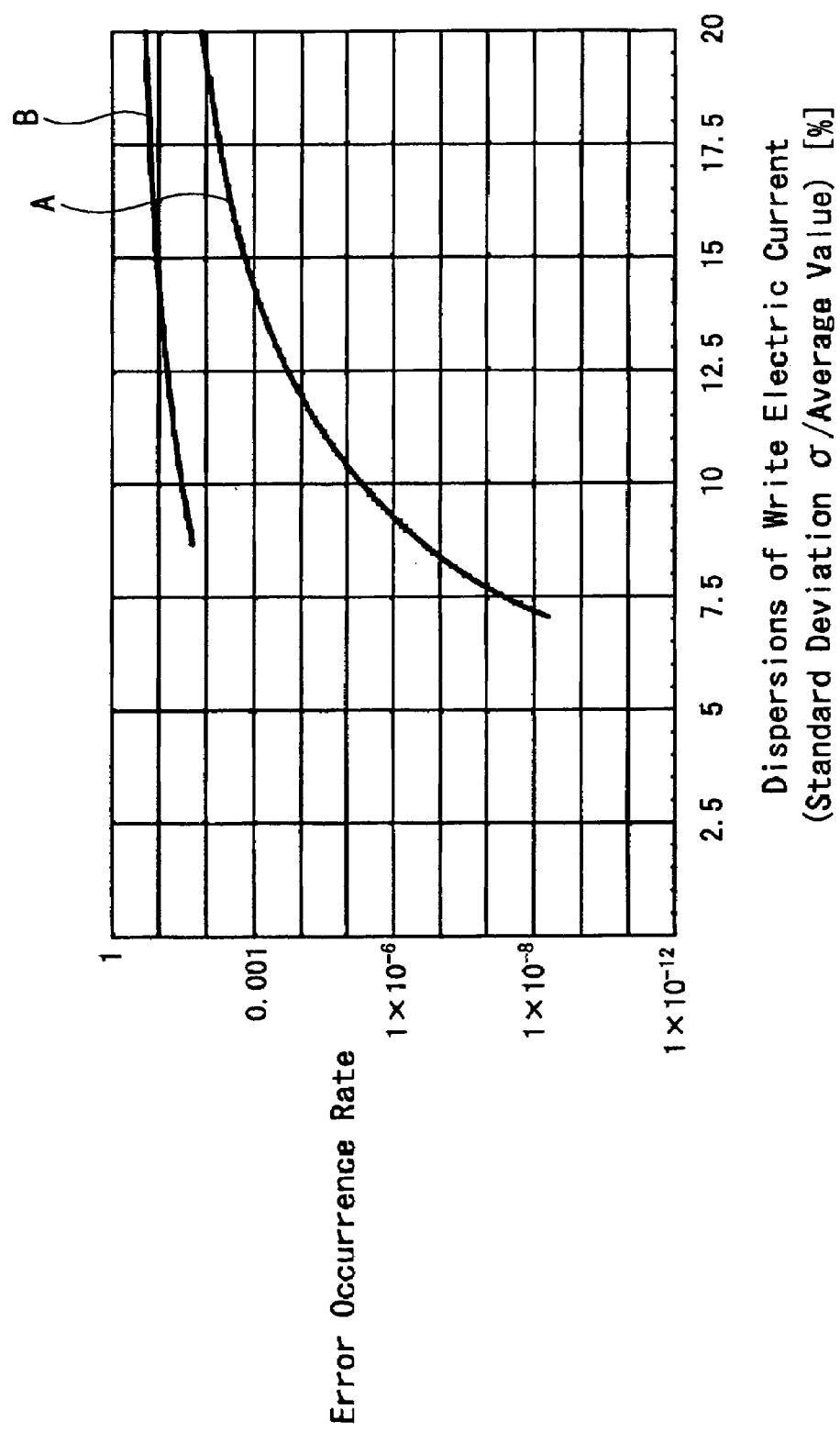
FIG. 5 is a diagram showing the rate in which errors occur in the devices corresponding to the cases shown in FIGS. 4A to 4D.

FIG. 5 is a diagram showing the occurrence rate in which errors occur in the devices corresponding to the cases shown in FIGS. 4A to 4D. In FIG. 5, a vertical axis represents the occurrence rate of erroneous write errors caused when a write electric current distribution and a read electric current overlap with each other, and a horizontal axis represents dispersions of a write electric current. Measured dispersions of the read electric currents of the devices are 1.5% in view of the standard deviation δ/average value.

In FIG, 5, a curve A corresponds to the device that shows the operation electric current relationship shown in FIG. 4B or 4C, and a curve B corresponds to the device that shows the operation electric current relationship shown in FIG. 4A or 4D.

It is clear from FIG. 5 that the occurrence rate of error can be considerably reduced in the case of the curve A which shows the relationship shown in FIG. 4B or 4C.

Then, if the operation electric current relationship shown in FIG. 4B or 4C is obtained, then it becomes possible to easily decrease errors without considerably improving dispersions of the write electric current.

The preferred embodiments of the present invention will be described next.

Figure 6:
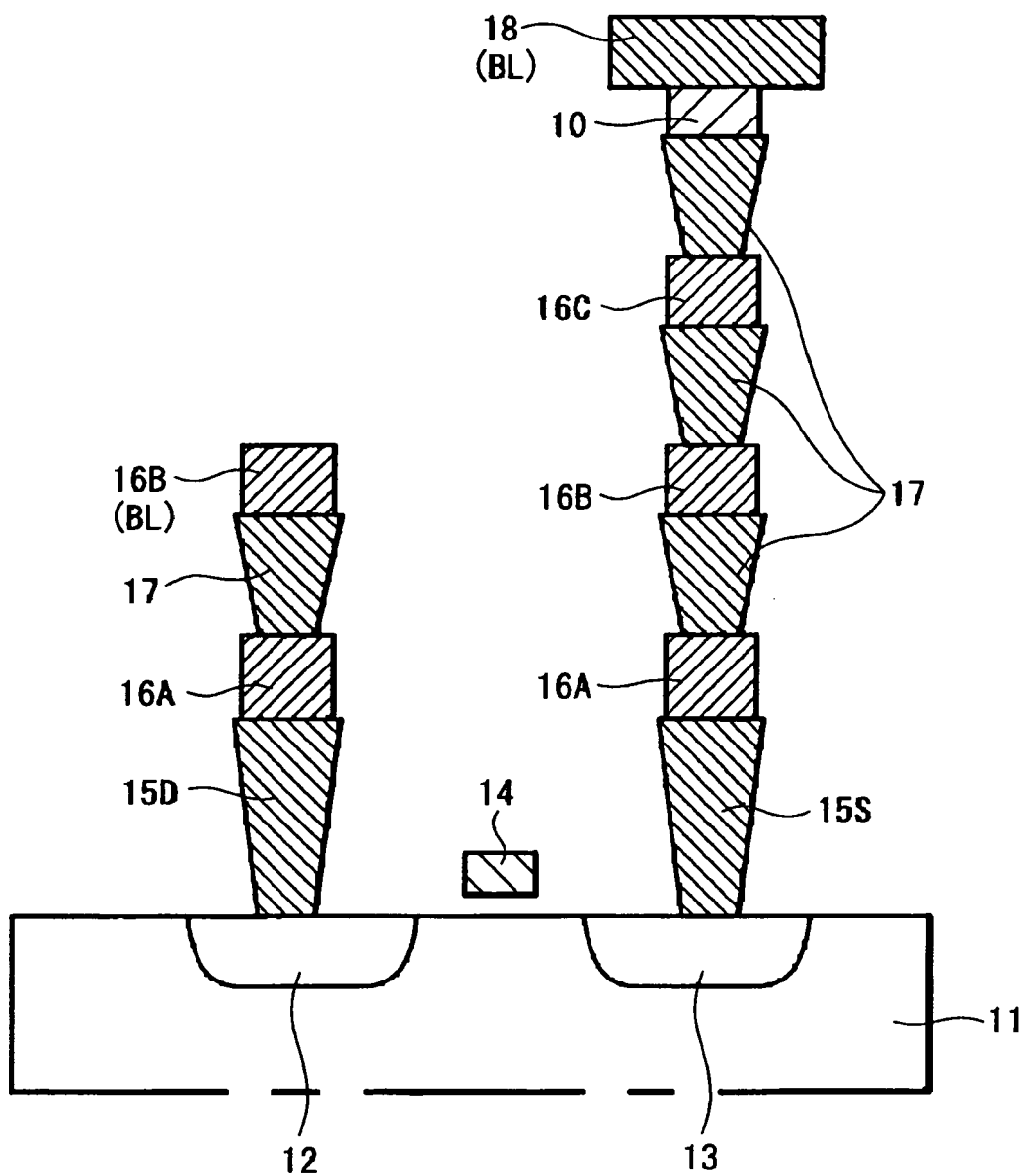
FIG. 6 is a schematic diagram (cross-sectional view of one memory cell) showing an arrangement of a memory according to an embodiment of the present invention.

FIG. 6 is a diagram (cross-sectional view) showing a schematic arrangement of a memory according to an embodiment of the present invention. More specifically, FIG. 6 is a cross-sectional view showing an arrangement of one memory cell constructing a memory (storage device) according to the present invention.

In this memory, as shown in FIG. 6, a memory cell is composed of a storage element 10 capable of storing information based on the magnetization state.

This storage element 10 includes a storage layer formed of a ferromagnetic layer of which magnetization direction is inverted by spin transfer.

As shown in FIG. 6, this memory includes a semiconductor substrate 11 such as a silicon substrate on which a drain region 12, a source region 13 and a gate electrode 14 constructing a selection transistor to select each memory cell are respectively formed.

Of the drain region 12, the source region 13 and the gate electrode 14, the gate electrode 14 is connected to a word line WL (see FIGS. 7A and 7B) which exists in the cross section different from FIG. 6. The drain region 12 is connected through a contact layer 15D, a wiring layer 16A of a first layer and a buried metal layer 17 to a sense line SL formed of a wiring layer 16B of a second layer. The source region 13 is connected to the storage element 10 through a contact layer 15S, the wiring layer 16A of the first layer, the wiring layer 16B of the second layer, a wiring layer 16C of a third layer and the buried metal layers 17 among the respective wiring layers 16A, 16B and 16C.

Then, the storage element 10 is connected to a bit line BL formed of a wiring layer 18 of a fourth layer provided thereon.

If the drain region 12 is made common to two selection transistors, for example, then it becomes possible to make the sense line SL become common to the two memory cells.

Figure 7:
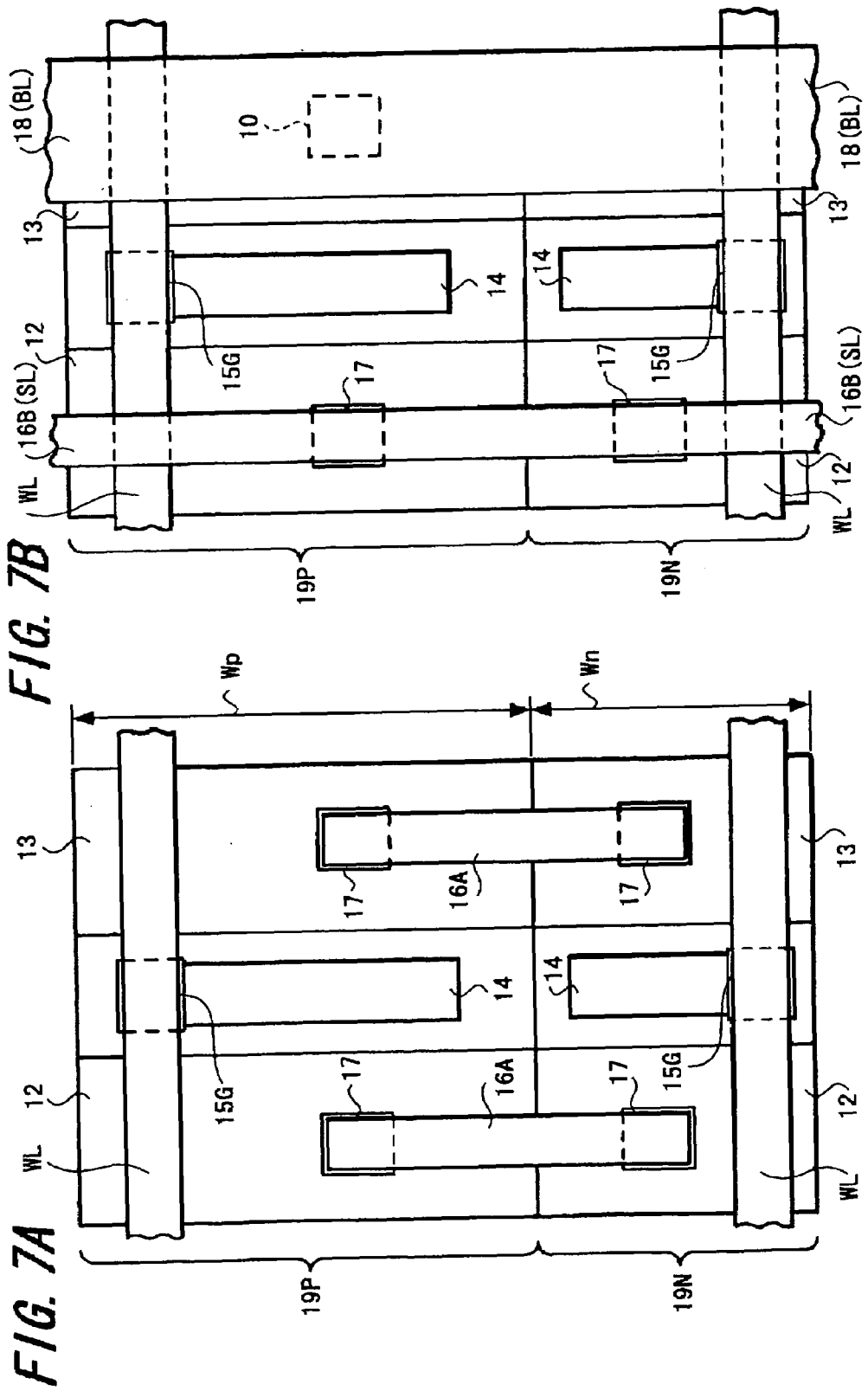
FIG. 7A is a plan view showing the lower layers of the wiring layer of the first layer of the memory cell shown in FIG. 6.
FIG. 7B is a top view of the memory cell shown in FIG. 6.

FIG. 7A is a plan view showing the lower layer from the wiring layer 16A of the first layer of one memory cell of the memory according to the embodiment of the present invention and FIG. 7B is a top view thereof.

As shown in FIGS. 7A and 7B, the selection transistor is constructed by electrically connecting the sources and drains of an NMOS (N type metal-oxide semiconductor) transistor 19N and a PMOS (P type metal-oxide semiconductor) transistor 19P through the wiring layer 16A of the first layer.

Thus, these NMOS transistor 19N and PMOS transistor 19P constitute a so-called transfer gate.

Then, this transfer gate is able to switch the memory cell such that an electric current may be permitted to flow through the storage element 10 or an electric current may be inhibited from flowing through the storage element 10.

The gate electrode 14 of the PMOS transistor 19P is connected through a contact layer 15G to the word line WL formed of the wiring layer 16A of the first layer. The gate electrode 14 of the NMOS transistor 19N is connected through the contact layer 15G to the word line WL. In response to ON and OFF of an electric current flowing through the storage element 10, a control signal is supplied to one of the word line WL of the side of the PMOS transistor 19P and the word line WL of the side of the NMOS transistor 19N and a control signal which results from inverting the same control signal by an inverter is supplied to the other of the word line WL of the side of the PMOS transistor 19P and the word line WL of the side of the NMOS transistor 19N.

With respect to the size of the selection transistor, a width Wn of the NMOS transistor 19N, for example, is set to be 1 μm and a width Wp of the PMOS transistor 19P is set to be 1.5 μm.

When a positive or negative electrical potential difference is applied to the bit line BL and the sense line SL and a voltage is applied to the word line WL to energize the transfer gate, an electric current can flow to any one of the directions of the lamination layer direction of the storage element 10.

Figure 8:
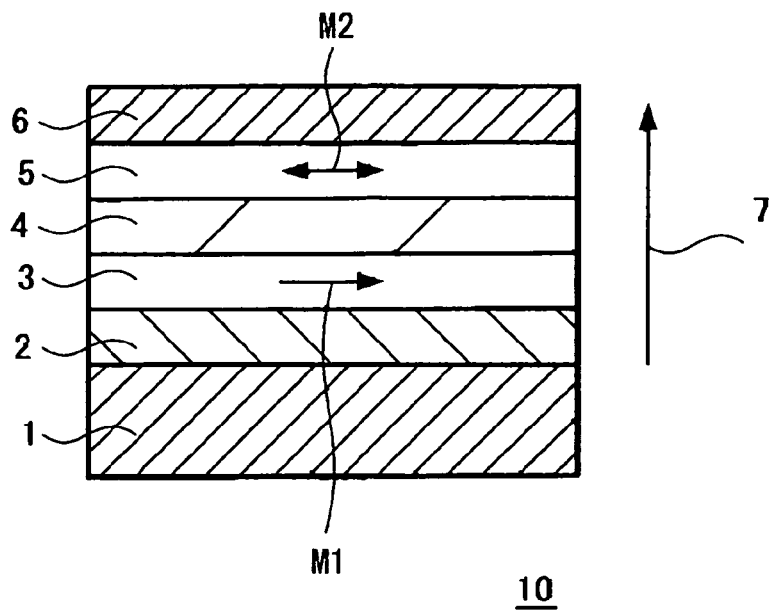
FIG. 8 is a schematic diagram (cross-sectional view) showing an arrangement of the storage element shown in FIG. 6.

FIG. 8 is a diagram (cross-sectional view) showing a schematic arrangement of the storage element 10 constructing the memory according to the embodiment of the present invention.

As shown in FIG. 8, this storage element 10 is composed of an underlayer 1, an antiferromagnetic layer 2, a magnetization fixed layer 3, a nonmagnetic layer 4, a storage layer 5 and a capping layer 6 laminated, in that order, from the lower layer.

The antiferromagnetic layer 2 is provided below the magnetization fixed layer 3 and the direction of a magnetization M1 of the magnetization fixed layer 3 is fixed by this antiferromagnetic layer 2. As shown in FIG. 8, the direction of the magnetization M1 of the magnetization fixed layer 3 is fixed to the right-hand side.

The storage layer 5 is able to store therein information based on the magnetization state, that is, the direction of a magnetization M2 of the storage layer 5 and it is able to store therein information based on whether the magnetization M2 is directed in the right-hand side or the left-hand side.

Also, since the nonmagnetic layer 4 is provided between the storage layer 5 and the magnetization fixed layer 3, the storage layer 5 and the magnetization fixed layer 3 constitute a GMR (giant magnetoresistive) device or a MTJ (magnetic tunnel junction) device. As a result, it is possible to detect the direction of the magnetization M2 of the storage layer 5 by using a magnetoresistive effect.

More specifically, when the direction of the magnetization M2 of the storage layer 5 is parallel (directed in the right-hand side direction) to the direction (right-hand side direction) of the magnetization M1 of the magnetization fixed layer 3, an electric resistance is decreased. Also, when the direction of the magnetization M2 of the storage layer 5 is anti-parallel (left-hand side direction) to the direction of the magnetization M1 of the magnetization fixed layer 3, an electric resistance is increased. Thus, it is possible to detect the direction of the magnetization M2 of the storage layer 5 by using the magnetoresistive effect.

While materials of the magnetization fixed layer 3 and the storage layer 5 are not limited in particular, an alloy material made of one kind of or more than two kinds of iron, nickel and cobalt can be used as the materials of the magnetization fixed layer 3 and the storage layer 5. Further, the materials of the magnetization fixed layer 3 and the storage layer 5 may contain transition metal elements such as Nb and Zr and light metals such as B.

Alloys of metal elements such as iron, nickel, platinum, iridium and rhodium and manganese, oxide of cobalt and nickel and the like can be used as the material of the antiferromagnetic layer 2.

The nonmagnetic layer 4 is composed of a nonmagnetic conductive layer or an insulating layer such as a tunnel barrier layer. The nonmagnetic conductive layer can be made of a suitable material such as ruthenium, copper, chromium, gold and silver. The tunnel barrier layer can be made of an insulating material such as aluminum oxide.

According to this embodiment, in particular, when electrons are transferred to the storage element 10 in the direction shown by an arrow 7 in FIG. 8 from the underlayer 1 to the capping layer 6, that is, in the direction from the magnetization fixed layer 3 to the storage layer 5, information can be read out from the storage layer 5. Then, the electric current supplying means such as the electrodes, the wirings BL, SK and the power supply should be constructed such that electrons may be transferred to the arrow 7 direction when information is read out from the storage layer 5.

At that time, the read electric current Ir (Ir0, Ir1) may flow in the direction opposite to the arrow 7 direction in which electrons are transferred, that is, in the direction from the capping layer 6 to the underlayer 1.

Since this read electric current Ir corresponds to the aforementioned negative polarity electric current and it has the same polarity as that of the electric current (electric current to transfer electrons from the magnetization fixed layer 3 to the storage layer 5) Iw1 to write the low resistance state, the lamination layer film arrangement of the storage element 10 according to this embodiment and the polarity of the read electric current correspond to those of the case shown in FIG. 4C.

Accordingly, as shown in FIG. 5, it is possible to decrease the rate in which errors occur due to the interference between the read electric current and the write electric current.

According to the above-mentioned arrangement of the memory of this embodiment, when information is read out from the storage layer 5 of the storage element 10, the electric current of the same negative polarity at that of the electric current −Iw (Iw1) to write information (record information) such that the electric resistance of the storage element 10 may be changed from the high resistance state to the low resistance state flows through the storage element 10. Thus, when the storage element 10 is placed in the low resistance state upon reading, even if the distribution of the read electric current Ir1 partly overlaps with that of the write electric current −Iw, then information that is to be written by the read electric current Ir is limited to only the low resistance state.

As a result, the rate in which errors in which the resistance state is changed by the read electric current occur can be suppressed and it is possible to essentially decrease the occurrence rate in which the errors occurred due to interference between the distribution of the read electric current and the distribution of the write electric current.

Accordingly, since the rate in which the errors caused by the interference between the distribution of the read electric current and the distribution of the write electric current can be decreased, even when dispersions of a certain amount occur in the write electric current at every memory cell, it becomes possible to considerably decrease the occurrence rate in which the errors occurs due to the interference.

Accordingly, it becomes possible to easily realize the highly-reliable memory.

Next, a storage element constructing a memory according to another embodiment of the present invention will be described next with reference to FIG. 9.

Figure 9:
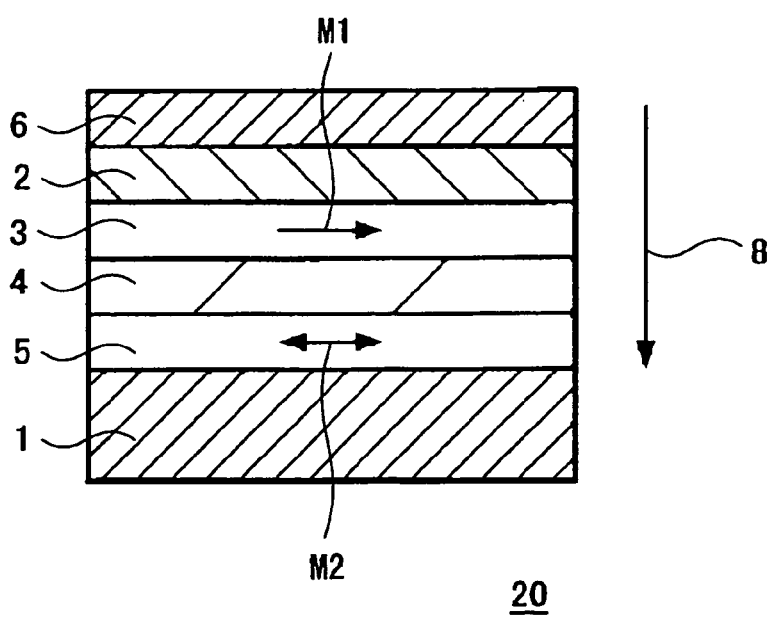
FIG. 9 is a schematic diagram (cross-sectional view) showing an arrangement of a storage element constructing a memory according to another embodiment of the present invention.

FIG. 9 is a diagram (cross-sectional view) showing a schematic arrangement of a storage element constructing a memory according to another embodiment of the present invention.

In this embodiment, as shown in FIG. 9, a storage element 20 is composed of the underlayer 1, the storage layer 5, the nonmagnetic layer 4, the magnetization fixed layer 3, the antiferromagnetic layer 2 and the capping layer 6 laminated, in that order, from the lower layer. That is, the order in which the magnetization fixed layer 3 and the storage layer 5 are laminated with each other is opposite to that of the storage element 10 shown in FIG. 8.

A rest of the arrangement is similar to that of the arrangement of the storage element 10 according to the preceding embodiment. Therefore, in FIG. 9, elements and parts identical to those of FIG. 8 are denoted by identical reference numerals and need not be described.

Also, other portions of the memory can be constructed similarly to the memory according to the preceding embodiment shown in FIG. 6 and FIGS. 7A and 7B.

Further, according to this embodiment, in particular, when electrons are transferred from the capping layer 6 to the underlayer 1 in the direction shown by an arrow 8 in FIG. 9, that is, in the direction from the magnetization fixed layer 3 to the storage layer 5, information can be read out from the storage layer 5. Then, the electric current supplying means such as the electrodes, the wirings BL, SL and the power supply are constructed such that electrons may be transferred to the direction shown by the arrow 8 in FIG. 9 upon reading.

At that time, the read electric current Ir (Ir0, Ir1) flows in the direction opposite to the direction in which electrons are transferred, that is, in the direction from the underlayer 1 to the capping layer 6.

Since this read electric current Ir corresponds to the aforementioned positive polarity electric current and it has the same polarity as that of the electric current (electric currents to transfer electrons from the magnetization fixed layer 3 to the storage layer 5) to write information of the low resistance state, the lamination layer film arrangement of the storage element 20 according to this embodiment and the polarity of the read electric current correspond to those of the case of the device shown in FIG. 4B.

According to the above-mentioned arrangement of the memory of this embodiment, when information is read out from the storage layer 5 of the storage element 20, the electric current of the same positive polarity as that of the electric current +Iw (Iw1) to write information (record information) such that the electric resistance of the storage element 20 may be changed from the high resistance state to the low resistance state flows through the storage element 20. Thus, when the storage element 20 is placed in the low resistance state upon reading, even if the distribution of the read electric current Ir1 partly overlaps with that of the write electric current +Iw, then information that is to be written by the read electric current Ir is limited to only the low resistance state.

As a result, the rate in which errors in which the resistance state is changed by the read electric current occur can be suppressed and it is possible to essentially decrease the occurrence rate in which errors occur due to the interference between the distribution of the read electric current and the distribution of the write electric current.

Accordingly, since the occurrence rate in which the errors caused by the interference between the distribution of the read electric current and the distribution of the write electric current can be decreased, even when dispersions of a certain amount occur in the write electric current at every memory cell, it becomes possible to considerably decrease the occurrence rate in which errors occur due to the interference.

Accordingly, it becomes possible to easily realize the highly-reliable memory.

The layer arrangements of the storage elements according to above-mentioned respective embodiments can be varied insofar as they play their essential roles.

For example, the magnetization fixed layer is not limited to the lamination layer formed with the antiferromagnetic layer but it may be formed of a ferromagnetic material which may have large coercive force independently.

Also, the magnetic material layer constructing the storage layer and the magnetization fixed layer is not limited to the magnetic material layer of the single layer and it can be formed by directly laminating magnetic material layers of more than two layers with different compositions or it can be formed so as to have a lamination layer ferri structure in which more than two layers of magnetic layers are laminated through nonmagnetic layers.

Further, the present invention is not limited to the case in which the absolute values of the write electric currents +Iw and −Iw of positive and negative polarities are equal to each other as shown in FIGS. 4B and 4C and it can also be applied to the case in which absolute values of write electric currents of positive and negative polarities are different from each other.

Furthermore, the above-mentioned operation principle of the present invention is not limited to the memory using the spin transfer and it can be generally applied to a memory in which information ("0" information and "1" information) is recorded with application of a bipolar electric current and in which information is read out by detecting a resistance change with application of an electric current of an arbitrary direction.

As described above, according to the present invention, since the rate in which errors occur due to the interference between the distribution of the read electric current and the distribution of the write electric current can be decreased, even when a certain amount of dispersions occurs in the write electric current at every memory cell, it becomes possible to considerably decrease the rate in which the errors occur due to the interference.

Therefore, according to the present invention, it becomes possible to easily realize the highly-reliable memory.

It should be understood by those skilled in the art that various modifications, combinations, sub-combinations and alterations may occur depending on design requirements and other factors insofar as they are within the scope of the appended claims or the equivalents thereof.

What is claimed is:

1. A memory comprising:
   a storage element including a storage layer for storing therein information based on a magnetization state of a magnetic material and a magnetization fixed layer provided relative to said storage layer through an intermediate layer in which a direction of magnetization of said storage layer is changed with application of an electric current flowing to a lamination layer direction to record information on said storage layer; and
   electric current supplying means for applying an electric current to said storage element in said lamination layer direction, wherein when information is read out from said storage layer, an electric current of a same polarity as that of an electric current to record information in such a manner that an electric resistance of said storage element is changed from a high resistance state to a low resistance state flows through said electric current supplying means to said storage element.

* * * * *